United States Patent [19]
Weissman
[11] 3,916,330
[45] Oct. 28, 1975

[54] LIMITING CIRCUIT

[75] Inventor: Barry Weissman, Lawrence Township, Mercer County, N.J.
[73] Assignee: Western Electric Company, Inc., New York, N.Y.

[22] Filed: Dec. 27, 1973
[21] Appl. No.: 428,985

[52] U.S. Cl. 328/171; 307/237
[51] Int. Cl.[2] H03K 5/08; H03B 3/02
[58] Field of Search 307/237, 229; 328/168, 328/171

[56] References Cited

UNITED STATES PATENTS 3,404,348 10/1968 Hansen et al. 307/237 X
3,541,459 11/1970 Webb 307/237 X
3,697,780 10/1972 Michael et al. 307/237 X

*Primary Examiner*—John Zazworsky
*Attorney, Agent, or Firm*—G. D. Green

[57] ABSTRACT

A limiting circuit comprises an operational amplifier that reverse biases a limiting diode connected to a load when a signal potential applied to the load through a dropping resistor is less than a reference potential, and forward biases the limiting diode when the applied signal potential is greater than the reference potential, thus preventing the potential applied to the load from exceeding the reference potential.

5 Claims, 3 Drawing Figures

LIMITING CIRCUIT

BACKGROUND OF THE INVENTION

1. Field of the Invention

This invention pertains to limiting circuits and, more particularly, to sharp cutoff limiting circuits for low-level signals.

2. Prior Art

Circuits for limiting, clipping, or clamping, which are essentially analogous functions, are well known in the prior art. Typically, such circuits are used for limiting the magnitude of a potential applied across a load by a signal source.

A limiting circuit is often necessary to protect an accepting circuit from an input signal that may inadvertently exceed the input rating of the accepting circuit. Such a situation may exist, for example, in an industrial environment where signals from transducers are connected to solid state multiplexing circuits, and where these signals may occasionally exceed the input rating of the multiplexing circuit because of an excessive output from the transducers or because of transients induced in the conductors linking the transducers to the multiplexing circuits. It would be desirable in such an application to provide a limiting circuit for each input to the multiplexing circuit to prevent either damaging or inhibiting the response of the multiplexing circuit because of excessive input signal magnitudes. In such an application, it is also clearly desirable that the limiting circuit not affect the signal when it is less than the limiting magnitude, to avoid distorting the information conveyed by the instrumentation signal.

An example of a prior art limiting circuit comprises a limiting diode connecting the load to a source of reference potential. In operation, the limiting diode is reverse biased when the signal potential is smaller in magnitude than the reference potential and is forward biased to conduct when the signal potential exceeds the reference potential by a sufficiently large amount. Such a circuit is illustrated in Electronic Circuits by E. J. Angelo, McGraw Hill, 1958, at page 13.

A disadvantage of the prior art limiting circuits exemplified above is the adverse effect that the limiting diode can have on the signal being limited when the signal potential is about equal to the reference potential. This disadvantage renders prior art limiting circuits impractical for low-level signals, e.g., less than 1 volt, in applications where it is desired that the limiting circuit not affect the signal when the signal magnitude is less than the desired limiting value.

It is, therefore, desirable, and an object of this invention, to provide a circuit to sharply limit the maximum value of a low-potential signal that may be applied to a load, without affecting the signal when it is less than a limiting potential.

SUMMARY OF THE INVENTION

A limiting circuit is disclosed which comprises an operational amplifier having inputs connected to sources of a signal potential and a reference potential and an output connected through a limiting diode to a load, a dropping resistor connected between the signal source and the load, and a feedback diode connected between the output and one of the inputs of the operational amplifier. The operational amplifier reverese biases the limiting diode when the signal potential is less than the reference potential, with little effect on the signal, and forward biases the limiting diode when the signal potential is greater than the reference potential, thus limiting the potential applied across the load to substantially the reference potential.

Embodiments of the limiting circuit are disclosed for use with unipolar signals, either positive-going or negative-going, and bipolar signals.

DETAILED DESCRIPTION

Figure 1:
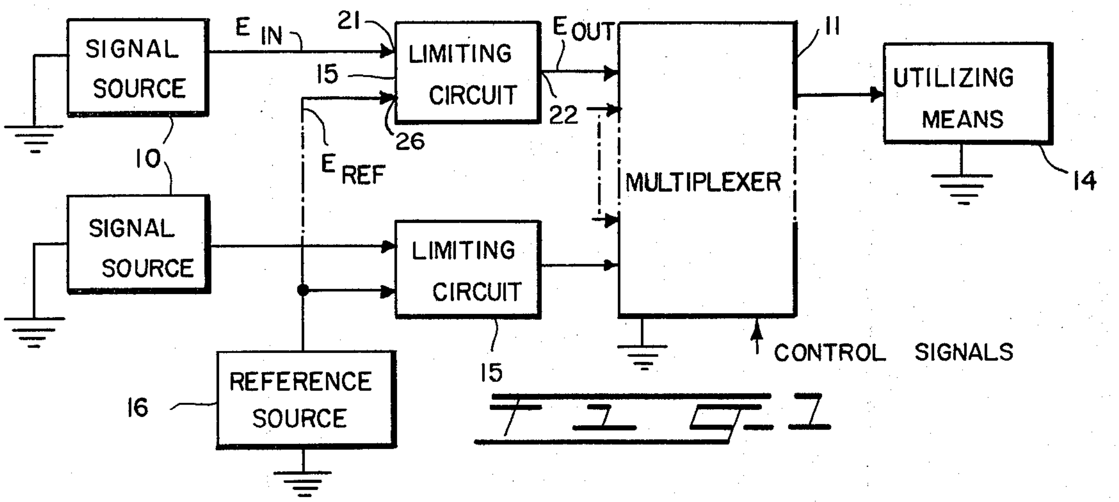
FIG. 1 is a schematic block diagram of a portion of an instrumentation system wherein the limiting circuit of the invention can be used.

Like numerals will be used to identify like elements in the different figures of the drawing.

FIG. 1 is a schematic block diagram of part of an exemplary instrumentation system wherein the limiting circuit of the invenetion can be used. Referring to FIG. 1, each transducer 10 develops an analog signal representing a parameter measured thereby. Multiplexer 11 accepts inputs from several transducers 10 and, directed by suitable control signals, connects a selected one of its inputs to utilizing means 14. Typically, multiplexer 11 is controlled to serially connect each transducer 10 to utilizing means 14 in repetitive cycles.

Multiplexer 11 is typically a semiconductor device that can be damaged or impaired in operation by input signals that exceed a certain potential. Therefore, it is desirable to connect a limiting circuit between each transducer 10 and multiplexer 11. Source 16 supplies a reference potential ($E_{REF}$) to each limiting circuit. As will become clear from the following description, limiting circuit 15 functions to sharply limit its output potential ($E_{OUT}$) to substantially $E_{REF}$, when $E_{IN}$ exceeds $E_{REF}$, without causing $E_{OUT}$ to differ substantially from $E_{IN}$ when $E_{IN}$ does not exceed $E_{REF}$.

Figure 2:
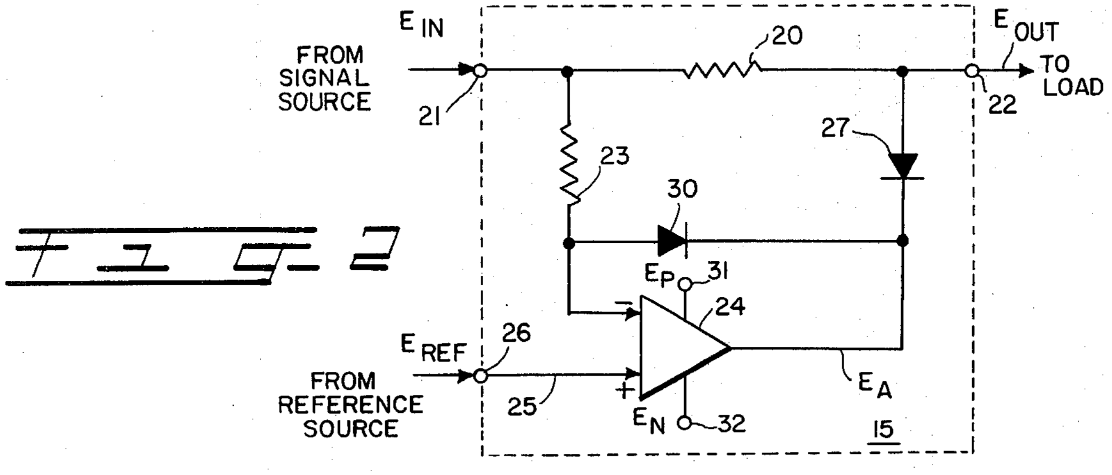
FIG. 2 is a circuit diagram of an embodiment of the limiting circuit, according to the invention, for limiting a positive potential signal.

FIG. 2 is a circuit diagaram of a limiting circuit 15, according to the invention, adapted for use with a positive signal potential. Referring to FIG. 2, dropping resistor 20 connects input terminal 21 to output terminal 22. Sensing resistor 23 connects input terminal 21 to the negative (−) input terminal of operational amplifier 24. Lead 25 connects $E_{REF}$ at terminal 26 to the positive (+) input terminal of amplifier 24. Limiting diode 27 connects the output terminal of amplifier 24 to output terminal 22. Feedback diode 30 connects the output terminal of amplifier 24 to the negative input terminal thereof. Diodes 27 and 30 are preferably chosen to have similar characteristics. Amplifier 24 is connected to an appropriate power source (not shown) that supplies a positive voltage ($E_P$) to terminal 31 and a negative voltage ($E_N$) to terminal 32.

In operation, the potentials of the positive and negative input terminals of an operational amplifier differ only slightly from each other. If one of the input terminals is connected directly to a potential source, the potential at the other terminal will be substantially the same as that of the potential source. For example, since the positive input terminal of operational amplifier 24 is connected directly to reference source $E_{REF}$, the negative input terminal of amplifier 24 will be at a potential substantially equal to $E_{REF}$. However, the potential at the negative input terminal will be slightly more positive than $E_{REF}$ if $E_{IN}$ is more positive than $E_{REF}$, and slightly more negative than $E_{REF}$ if $E_{IN}$ is more negative than $E_{REF}$. Any difference between $E_{IN}$ and $E_{REF}$ will appear as a voltage drop across sensing resistor 23.

The output of an operational amplifier, without feedback, tends to approach that of its positive supply voltage when its negative input becomes more negative than its positive input, and that of its negative supply voltage when its negative input becomes more positive than its positive input. For example, assuming that feedback diode 30 is disconnected, when $E_{IN}$ is more negative than $E_{REF}$, output voltage $E_A$ will substantially equal $E_p$; and when $E_{IN}$ is more positive than $E_{REF}$, $E_A$ will substantially equal $E_N$.

Feedback diode 30 modifies the operation of amplifier 24 when $E_{IN}$ is more positive than $E_{REF}$. As $E_{IN}$ becomes more positive than $E_{REF}$, $E_A$, becomes more negative, and forward biases feedback diode 30. However, because the negative input of amplifier 24 always remains substantially at $E_{REF}$, $E_A$ must then remain at $E_{REF}$ less the magnitude of the voltage drop $V_D$ across feedback diode 30. Thus, when $E_{IN}$ changes from more negative than $E_{REF}$ to more positive than $E_{REF}$, $E_A$ changes from substantially $E_P$ to $E_{REF} - N_D$.

The output potential $E_{OUT}$ of limiting circuit 15 is a function of either input potential $E_{IN}$ or the output potential $E_A$ of amplifier 24. For the case when $E_{IN}$ is more negative than $E_{REF}$, $E_A$ will substantially equal $E_P$, and limiting diode 27 will be strongly reverse-biased, since $E_A$ is then much more positive than $E_{IN}$. The output potential $E_{OUT}$ will then be $E_{IN}$ less whatever voltage drop is caused by current flowing through resistor 20. Such current would typically be negligible in an instrumentation system as shown in FIG. 1, because of the relatively high input impedance of multiplexer 11. Therefore, $E_{OUT}$ will substantially equal $E_{IN}$.

For the case when $E_{IN}$ is more positive than $E_{REF}$, $E_A$ will substantially equal $E_{REF} - V_D$, and since this voltage will be less than $E_{IN}$ by at least $V_D$, limiting diode 27 will become forward biased. Since diodes 27 and 30 are chosen to have similar characteristics, the voltage drops across diodes 27 and 30 will be substantially equal when the currents therethrough are equal. If the currents are unequal, the voltage drops will differ slightly. Generally speaking, however, the voltage drops across diodes 27 and 30 are substantially equal when both diodes are conducting. Therefore, $E_{OUT}$ will equal $E_A + V_D$, or $E_{REF}$. A voltage will develop across dropping resistor 20 equal to the difference between $E_{IN}$ and $E_{REF}$.

If resistors 20 and 23 are equal, and a high-impedance load is attached to terminal 22, the current through diodes 27 and 30 will be substantially equal regardless of the magnitude of $E_{IN}$. However, sensing resistor 23 is typically larger than dropping resistor 20, so that the current through feedback diode 30 is typically smaller than the current through limiting diode 27, resulting in a smaller voltage drop across feedback diode 30 than across limiting diode 27. This difference in voltage drops will result in a slight increase in $E_{OUT}$ with respect to $E_{REF}$ as $E_{IN}$ becomes much more positive than $E_{REF}$. If necessary, this slight increase can be offset by adding a resistor or an additional diode in series with feedback diode 30.

Summarizing the operation of the limiting circuit of the invention as shown in FIG. 2, when $E_{IN}$ is more negative than $E_{REF}$, $E_A$ strongly reverse biases feedback diode 27 and $E_{OUT}$ substantially equals $E_{IN}$. However, when $E_{IN}$ becomes more positive than $E_{REF}$, $E_A$ switches to become equal to $E_{REF} - V_D$, forward biasing limiting diode 27 so that $E_{OUT}$ becomes substantially equal to $E_{REF}$.

The input impedance of an operational amplifier such as amplifier 24 is high, on the order of 100 meg Ω. Thus, little current will be drained by amplifier 24 from the reference source or 24 from the signal source, and the reference source need not provide a large output current.

The following voltages and components are exemplary for the inventive circuit of FIG. 2.

| | |
|---|---|
| Amplifier 24 | Fairchild type 741 |
| Resistor 20 | 4.7 KΩ |
| Resistor 23 | 10 KΩ |
| Diodes 27 and 30 | 1N 914 |
| $E_P$ | +15v |
| $E_N$ | −15v |
| $E_{REF}$ | 0.1v to 10v |

Clearly, one skilled in the art could vary these components and voltages without departing from the spirit or scope of the invention.

The limiting circuit of the invention can be used satisfactorily with low-level signals that would preclude the use of prior art limiting circuits such as described earlier. Thus, $E_{REF}$ could be set to a value such as +0.5 volts, so that $E_A \approx E_P$ when $E_{IN}$ is more negative than +0.5 volts, but $E_A \approx E_{REF} - V_D$ when $E_{IN}$ is more positive than +0.5 volts. If $V_D$ is about 0.7 volts, typical for a silicon diode, then $E_{REF} - V_D$ will be −0.2 volts and $E_{OUT}$ will be limited at +0.5 volts. Clearly, such limiting action could not be achieved with a limiting diode alone biased with a voltage of −0.2 volts, since the limiting diode would partially conduct, affecting $E_{OUT}$, for values of $E_{IN}$ less than +0.5 volts. Thus, the action of amplifier 24 in switching the biasing voltage $E_A$ for limiting diode 27 makes the use of limiting circuit 15 practical for low-level signals.

Figure 3:
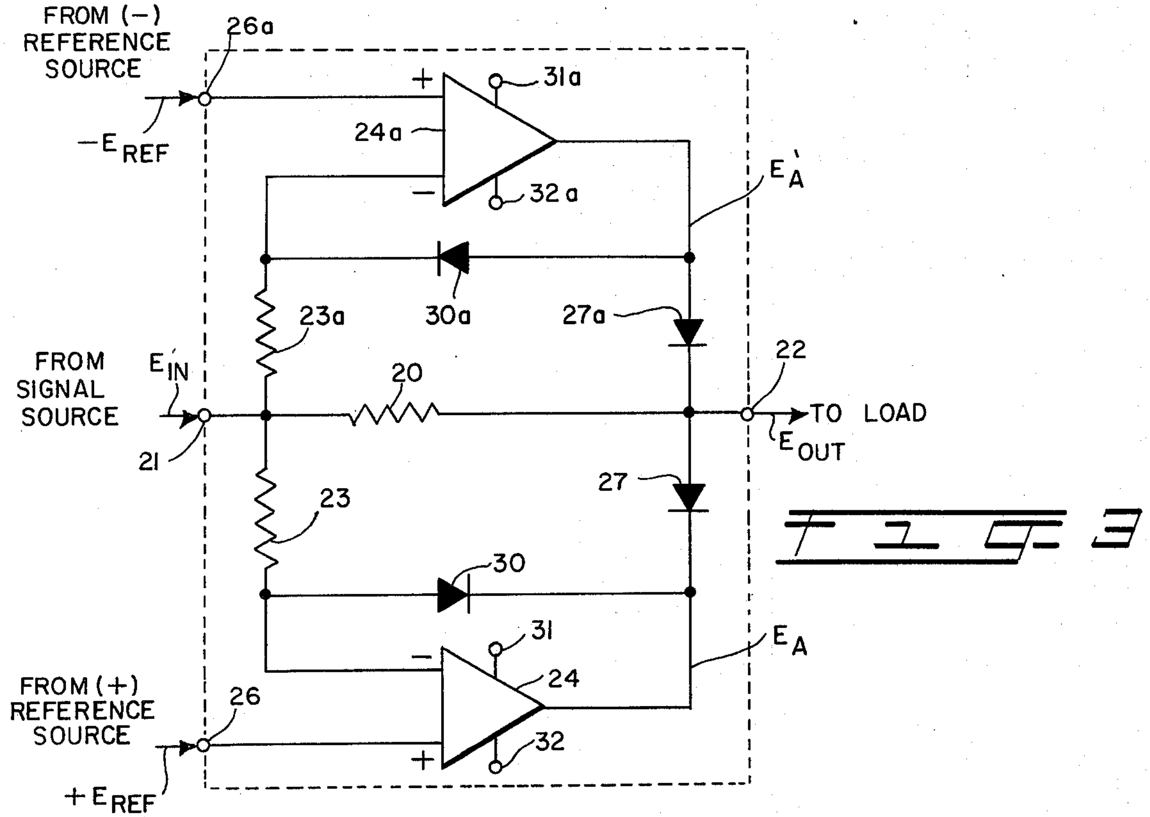
FIG. 3 is a circuit diagram of a limiting circuit, according to the invention, for limiting a bipolar potential signal.

The circuit of FIG. 2 can be adapted for negative and bipolar signals. An adaptation for bipolar signals is shown in FIG. 3. Referring to FIG. 3, the lower half of the circuit shown, which is identical to FIG. 2, limits the positive swings of a bipolar signal applied to input terminal 21. The upper half of the circuit shown, which limits the negative swings of $E_{IN}$, is similar to the lower half, except that the polarities of diodes **27*a* and 30*a* are reversed, and a negative reference potential $-E_{REF}$ is connected to terminal 26*a*. Note that dropping resistor 20** is common to both halves of the bipolar limiting circuit.

In operation, when $-E_{REF} < E_{IN} < +E_{REF}$, both diodes 27 and **27*a* will be reverse biased by amplifiers 24 and 24*a*. When $E_{IN} > +E_{REF}$, diode 27 will be forward biased by amplifier 24, and diode 27*a* will remain reverse biased by amplifier 24*a*. When $E_{IN} < -E_{REF}$, diode 27*a* will be forward biased by amplifier 24*a*, and diode 27** will remain reverse biased. Of course, the magnitudes of $+E_{REF}$ and $-E_{REF}$ can differ, if desired.

Clearly the top half of the limiting circuit shown in FIG. 3 can be used alone for an application in which negative-going voltage signals are to be limited.

What is claimed is:

1. Apparatus for limiting the magnitude of a signal applied to a load by a signal source to substantially the potential supplied by a reference source, which comprises:

a dropping resistor for connecting the signal source to the load;

a limiting diode having first and second terminals, the first terminal being connected to the load terminal of the dropping resistor;

an operational amplifier having a first input, a second input connectable to the reference source, and an output connected to the second terminal of the limiting diode;

a sensing resistor for connecting the signal source to the first input of the operational amplifier;

a feedback diode, a terminal thereof, corresponding to the second terminal of the limiting diode, being connected to the output of the operational amplifier, the other terminal thereof being connected to the first input of the operational amplifier; and the operational amplifier applying to the second terminal of the limiting diode (a) a first potential to reverse bias the limiting diode when the signal potential is less than the reference potential, and (b) a second potential to forward bias the limiting diode when the signal potential exceeds the reference potential, the second potential substantially equalling the reference potential minus the voltage drop across the forward biased limiting diode.

2. Apparatus of claim 1 wherein the potential applied across the load by the signal source is positive, the output of the operational amplifier is positive-going when the first input thereof becomes more negative than the second input thereof, and the limiting diode is forward biased when the first terminal thereof becomes more positive than the second terminal thereof.

3. Apparatus of claim 1 wherein the potential applied across the load by the signal source is negative, the output of the operational amplifier is positive-going when the first input thereof becomes more negative than the second input thereof, and the limiting diode is forward biased when the first terminal thereof is more negative than the second terminal thereof.

4. Apparatus for limiting the magnitude of a bipolar signal applied to a load by a signal source to substantially the potential supplied by a positive reference source when the signal is positive and at substantially the potential supplied by a negative reference source when the signal is negative, which comprises:

a dropping resistor for connecting the signal source to the load;

first and second limiting diodes, each having first and second terminals and being forward biased when the first terminal is positive with respect to the second terminal, the first terminal of the first limiting diode and the second terminal of the second limiting diode both being connected to the load terminal of the dropping resistor, first means, connected to the second terminal of the first limiting diode and connectable to the signal source and the positive reference source for applying to the second terminal of the first limiting diode (a) a first potential to reverse bias the first limiting diode when the signal potential is more negative than the positive reference potential, and (b) a second potential to forward bias the first limiting diode when the signal potential is more positive than the positive reference potential, the second potential substantially equalling the positive reference potential minus the voltage drop across the forward biased first limiting diode; and second means, connected to the first terminal of the second limiting diode and connectable to the signal source and the negative reference soure for applying to the first terminal of the second limiting diode (c) a third potential to reverse bias the second limiting diode when the signal potential is more positive than the negative reference potential and (d) a fourth potential to forward bias the second limiting diode when the signal potential is more negative than the negative reference potential, the fourth potential substantially equalling the negative reference potential minus the voltage drop across the forward biased second limiting diode.

5. Apparatus of claim 4 wherein the first applying means further comprises:

a first operational amplifier having a first input, a second input connectable to the positive reference source, and an output connected to the second terminal of the first limiting diode, the output of the first operational amplifier being positive-going when the first input thereof becomes more negative than the second input thereof;

a first sensing resistor for connecting the signal source to the first input of the first operational amplifier; and a first feedback diode, a terminal thereof, corresponding to the second terminal of the first limiting diode, being connected to the output of the first operational amplifier, the other terminal thereof being connected to the first input of the first operational amplifier; and where the second applying means further comprises:

a second operational amplifier having a first input, a second input connectable to the negative reference source, and an output connected to the first terminal of the second limiting diode, the output of the second operational amplifier being negative-going when the first input thereof becomes more positive than the second input thereof;

a second sensing resistor for connecting the signal source to the first input of the second operational amplifier; and a second feedback diode, a terminal thereof, corresponding to the first terminal of the second limiting diode, being connected to the output of the second operational amplifier, the other terminal thereof being connected to the first input of the second operational amplifier.

* * * * *

UNITED STATES PATENT OFFICE
CERTIFICATE OF CORRECTION

Patent No. 3,916,330 Dated October 28, 1975

Inventor(s) BARRY WEISSMAN

It is certified that error appears in the above-identified patent and that said Letters Patent are hereby corrected as shown below:

In the specification, Column 1, line 65, "reverese" should read --reverse--. Column 2, line 25, "invenetion" should read --invention--; line 44, "diagaram" should read --diagram--; line 65, "source, For" should read --source. For--. Column 3, line 27, "$E_{REF} - N_D$" should read --$E_{REF} - V_D$--.

In the claims, Column 6, line 14, "soure" should read --source--.

Signed and Sealed this

*third* Day of *February 1976*

[SEAL]

*Attest:*

RUTH C. MASON
*Attesting Officer*

C. MARSHALL DANN
*Commissioner of Patents and Trademarks*